US008160856B2

(12) United States Patent
Moorby

(10) Patent No.: US 8,160,856 B2
(45) Date of Patent: Apr. 17, 2012

(54) USING A SERIAL PROFILER TO ESTIMATE THE PERFORMANCE OF A PARALLEL CIRCUIT SIMULATION

(75) Inventor: Philip R. Moorby, South Hampton, NH (US)

(73) Assignee: Synopsys, Inc., Mountain View, CA (US)

( * ) Notice: Subject to any disclaimer, the term of this patent is extended or adjusted under 35 U.S.C. 154(b) by 1019 days.

(21) Appl. No.: 12/072,886

(22) Filed: Feb. 27, 2008

(65) Prior Publication Data
US 2009/0216515 A1 Aug. 27, 2009

(51) Int. Cl.
*G06F 17/50* (2006.01)
(52) U.S. Cl. ............... 703/14; 716/106; 716/125
(58) Field of Classification Search ............ 703/13, 703/14; 716/106, 107, 110, 118, 125
See application file for complete search history.

(56) References Cited

U.S. PATENT DOCUMENTS

| 6,886,145 B2* | 4/2005 | Davidson et al. | ............ 716/106 |
| 2004/0193393 A1* | 9/2004 | Keane | ............ 703/16 |
| 2005/0114110 A1* | 5/2005 | Rammel | ............ 703/14 |
| 2008/0140379 A1* | 6/2008 | Shah et al. | ............ 703/14 |
| 2008/0208553 A1* | 8/2008 | Borah et al. | ............ 703/14 |
| 2009/0150136 A1* | 6/2009 | Yang | ............ 703/13 |

OTHER PUBLICATIONS

Nicol et al., On Extending Parallelism to Serial Simulators, Ninth Workshop on Parallel and Distributed Simulation, 1995, pp. 60-67.*
Yang et al., Evaluation of a Parallel Branch-and-Bound Algorithm on a Class of Microprocessors, IEEE Transactions on Parallel and Distributed Systems, vol. 5, No. 1, Jan. 1994, pp. 74-86.*
Thiagarajan et al., Adapting EMAP3D to Parallel Processing, IEEE Transactions on Magnetics, vol. 37, No. 1, Jan. 2001, pp. 143-146.*
Nicol, D.M. Utility Analysis of Parallel Simulation, Seventeenth Workshop on Parallel and Distributed Systems, 2003, pp. 123-132.*

* cited by examiner

*Primary Examiner* — Russell Frejd
(74) *Attorney, Agent, or Firm* — Park, Vaughan, Fleming & Dowler LLP

(57) ABSTRACT

Some embodiments of the present invention provide a system that profiles a serial simulation of a circuit to estimate the performance of a parallel simulation of the circuit. During operation, the system profiles execution of module instances during a serial simulation of the circuit, wherein each module instance includes code which simulates signal propagation through a corresponding circuit module. Next, the system uses execution times for the module instances obtained from the serial simulation to estimate the performance of a parallel simulation of the circuit.

24 Claims, 5 Drawing Sheets

USING A SERIAL PROFILER TO ESTIMATE THE PERFORMANCE OF A PARALLEL CIRCUIT SIMULATION

BACKGROUND

1. Field

The present invention generally relates to computer-based tools for performing circuit simulations. More specifically, the present invention relates to a technique which uses a serial profiler to estimate the performance of a parallel circuit simulation.

2. Related Art

Circuit designers routinely perform simulations to determine how circuit designs will perform before the circuits are actually fabricated. As advances in integrated circuit technologies have enabled circuits to become increasingly more complex, such circuit simulations can take a longer time to complete in spite of the fact that the processors used to perform the simulations are becoming progressively faster. In fact, circuit simulations often take many days to complete, which can give rise to significant delays during the circuit-design process.

Traditionally, circuit simulation has been performed through a sequential process, and attempts to take advantage of multiple processors to parallelize circuit-simulation operations have not achieved any significant market successes to date. As new multi-core processor designs have enabled computer system manufacturers to offer low-cost multiprocessors with very fast interconnects, there is increasing pressure to use parallel processing to speed up circuit-simulation operations.

However, it is very difficult to predict what potential speedup can be attained by parallelizing a circuit simulation. It is also difficult to determine an optimal design partitioning to achieve the best parallel performance. Moreover, it is similarly difficult to understand why a particular parallel simulation job has performed poorly.

Hence, what is needed is a method and an apparatus for efficiently estimating the performance of a parallel circuit simulation.

SUMMARY

Some embodiments of the present invention provide a system that profiles a serial simulation of a circuit to estimate the performance of a parallel simulation of the circuit. During operation, the system profiles execution of module instances during a serial simulation of the circuit, wherein each module instance includes code which simulates signal propagation through a corresponding circuit module. Next, the system uses execution times for the module instances obtained from the serial simulation to estimate the performance of a parallel simulation of the circuit.

In some embodiments, profiling the execution of the module instances involves instrumenting code which simulates signal propagation through the module instances, and then serially executing the instrumented code to gather execution times for the module instances.

In some embodiments, the execution times for the module instances include execution times within the module instances, and execution times through ports which are used to communicate signals between module instances.

In some embodiments, estimating the performance of the parallel simulation involves: partitioning the circuit; and estimating the performance of the parallel simulation based on the partitioning and the execution times of the module instances within the partitions.

In some embodiments, the parallel simulation involves a master process and a set of slave processes, wherein the master process coordinates actions of the set of slave processes, and wherein each slave process is responsible for executing a different partition. In these embodiments, the parallel simulation involves iteratively executing delta time slices, wherein executing a delta time slice involves: executing the master process; executing the slave processes in parallel; and communicating between the master and slave processes.

In some embodiments, estimating the performance of the parallel simulation involves accounting for: an execution time of the master process; a maximum execution time across all of the slave processes; and a communication time between the master and slave processes.

In some embodiments, communicating between the master process and the slave processes involves communicating value changes that cross partition boundaries.

In some embodiments, estimating the performance of the parallel simulation involves estimating the performance of a parallel simulation for a number of possible partitionings of the circuit.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

Overview

One embodiment of the present invention provides a system which captures run-time data from serial simulation of a circuit to predict how effective a corresponding parallel simulation will be, and to determine the effectiveness of possible partitions of the circuit to facilitate parallel simulation. During this process, the system measures: the effective processor utilization during parallel simulation; the extent to which processes were blocked by other processes during parallel simulation; how balanced the workload on the processors was during the simulation; and the overhead involved in transferring value changes across the partitions.

In one embodiment of the present invention, a serial-simulation profiler can produce simulation results in a number of different forms, such as: (1) a graph of the top-most module instance sizes for verifying that a reasonable partition can be chosen for parallel simulation; (2) a view of the overall time spent in the top-most module instances; and (3) for each potential partition, an estimate of the utilization of the processors during the simulation.

Note that the term "module instance" as used in this specification and the appended claims is not meant to be limited to a specific construct defined in the Verilog hardware description language (VHDL). The term more generally refers to any grouping of elements in a design, even if the elements are not part of a specific Verilog module instance.

This serial-profiling process is described in more detail below.

Serial Profiling Process

Figure 1:
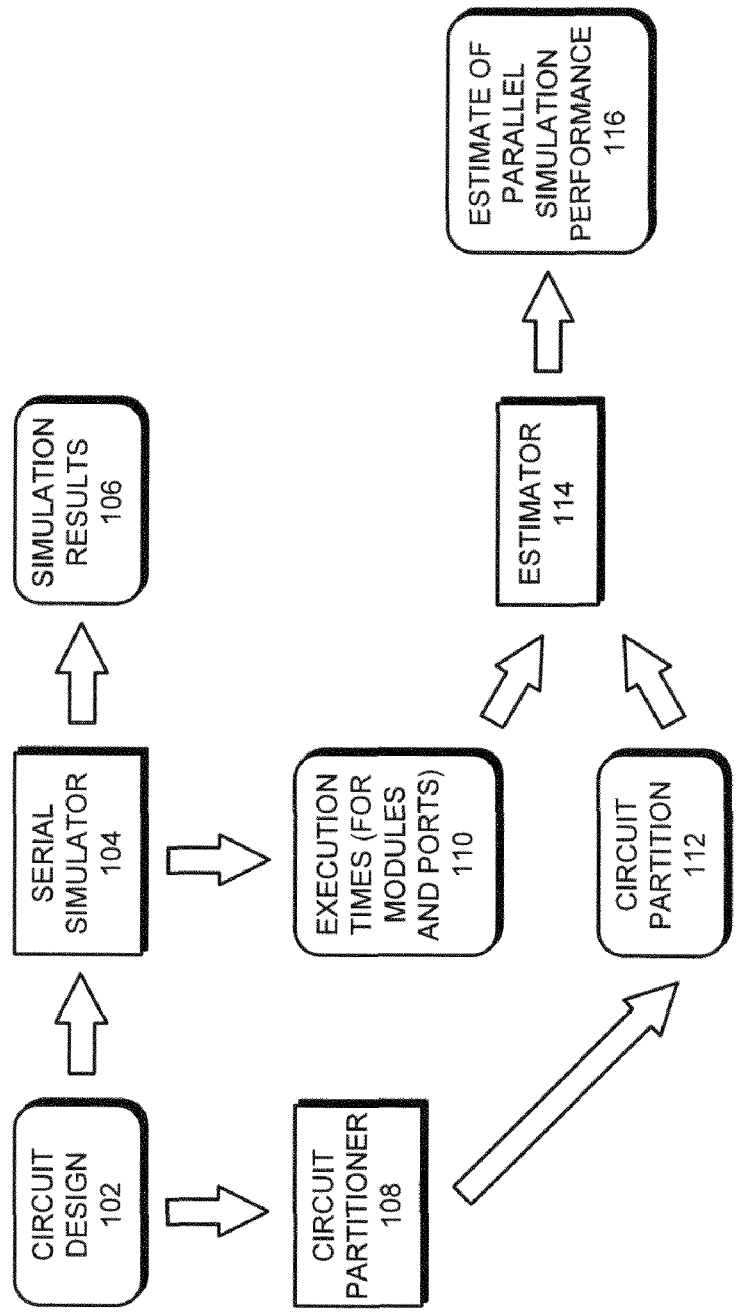
FIG. 1 illustrates the process of profiling serial simulation to estimate the performance of a parallel simulation in accordance with an embodiment of the present invention.

FIG. 1 illustrates the process of profiling serial simulation to estimate the performance of a parallel simulation in accordance with an embodiment of the present invention. During this process, a circuit design 102 is fed into a serial simulator 104 to produce simulation results 106. Circuit design 102 can include any representation a system comprises of circuits, which can be used as a basis for simulating the propagation of signals through the circuits. Similarly, serial simulator 104 can include any type of serial simulation software which can be used to simulate the propagation of signals through the circuits.

Serial simulator 104 additionally includes a profiling mechanism (not illustrated) which generates execution times 110 for software modules associated with corresponding circuit modules as well as for ports which are used to communicate value changes between the circuit modules. For example, a circuit module can include a large circuit structure, such as a memory management unit (MMU) or an arithmetic logic unit (ALU). The corresponding software module for a circuit module contains instructions that simulate the propagation of signals through the circuit module. Moreover, a given circuit module can be defined in terms of lower-level circuit modules. For example, an ALU can be defined in terms of lower-level adder and shifter modules.

Circuit modules communicate with each other through "ports," which define communication pathways for signals that pass between the corresponding circuit modules. Note that the ports are also implemented as software modules, and hence instructions within the ports will also take time to execute during a simulation of a circuit.

Figure 2:
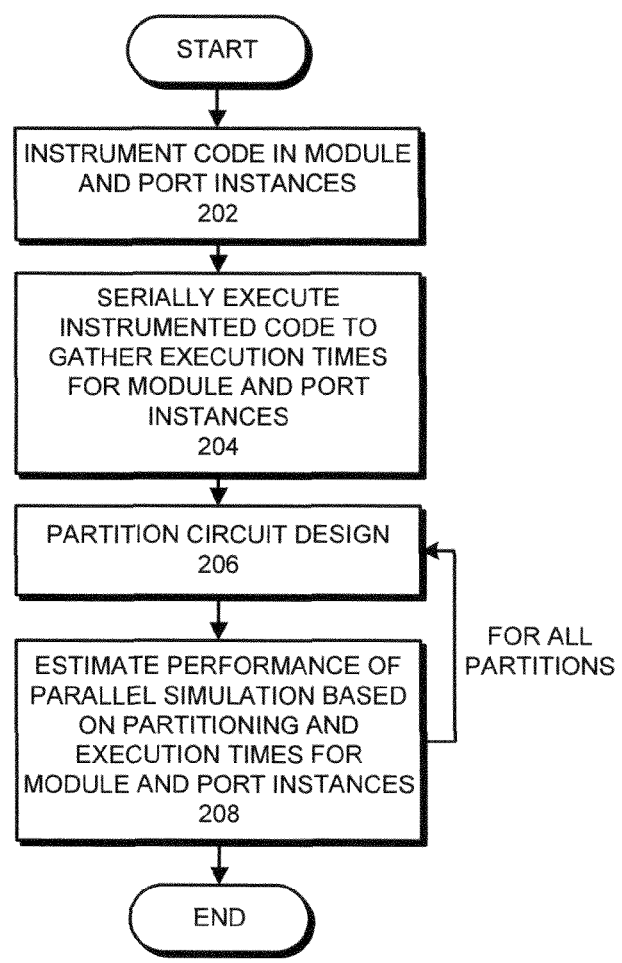
FIG. 2 presents a flow chart of the process of profiling serial simulation to estimate the performance of a parallel simulation in accordance with an embodiment of the present invention.

FIG. 2 presents a flow chart illustrating the process of profiling serial simulation to estimate the performance of a parallel simulation in accordance with an embodiment of the present invention. The first step in this process is to instrument code in the various module and port instances that comprise the circuit (step 202). This can involve inserting code and the beginning and the end of a piece of software that corresponds to a circuit module or a port to measure the time that it takes to execute the code within the module.

Next, the instrumented code is serially executed to gather execution times for the module instances and the ports (step 204).

After the execution times are gathered, the system partitions the circuit design (step 206). For example, this can involve dividing the module instances between partitions so that the module instances can be executed in parallel by different processes. In doing so, it is desirable to minimize the amount of communication between partitions, and more specifically to minimize the signal dependencies that cross partition boundaries.

Next, the system estimates the performance of a parallel simulation based on the partitioning and the measured execution times for the module instances and the ports (step 208). This estimation process involves accounting for the execution times of master and slave processes as is described in more detail below.

Steps 206 and 208 are then repeated for all the partitions.

Master and Slave Processes

Figure 3:
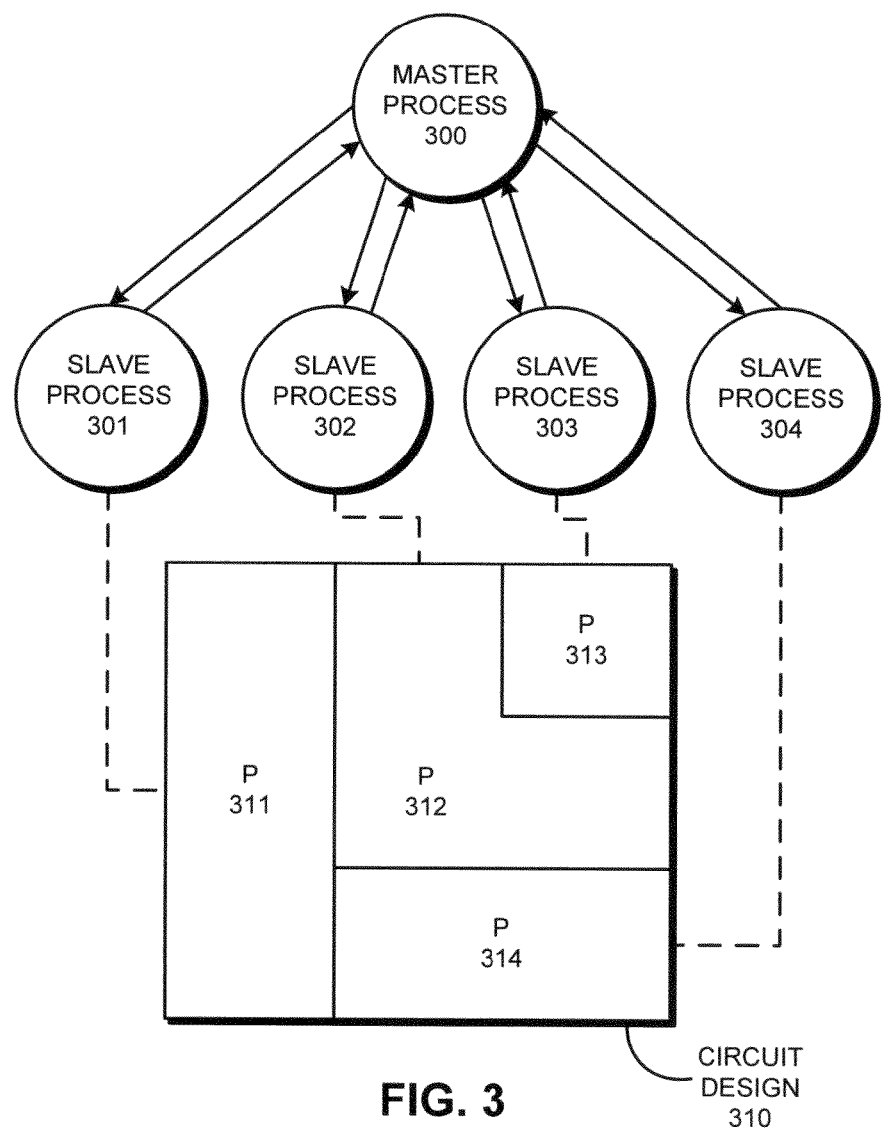
FIG. 3 illustrates master and slave processes in accordance with an embodiment of the present invention.

Some embodiments of the present invention parallelize a simulation by using a single master process and a number of slave processes, wherein each slave process is responsible for simulating a different partition of the design. For example, FIG. 3 illustrates a single master process 300 and a number of slave processes 301-304. In FIG. 3 a circuit design 310 is divided into a number of partitions 311-314 and partitions 311-314 are associated with respective slave processes 301-304. We refer to these partitions as "slave partitions." Note that the number of slave partitions is chosen based on the design structure and the number of available processors to perform the simulation.

As illustrated in FIG. 3, master process 300 communicates with the slave processes 301-304 to facilitate communications between slave processes 301-304. More specifically, master process 300 communicates value changes that cross partition boundaries, where the partitions are associated with the slave processes 301-304. For example, during a simulation if a value change in a signal line passes between partition 311 and partition 312, the value change is first communicated from slave process 301 (which simulates corresponding partition 311) to master process 300, and then from master process 300 to slave process 302 (which simulates corresponding partition 312).

These signal transfers are described in more detail below with reference to FIG. 4. Some embodiments of the present invention use a technique which efficiently passes signal values between the master and slave processes while effectively maintaining the simulated time synchronization between the master and slave processes. In these embodiments, a time synchronizer within the master process 300 divides the operation of the master process 300 into four cyclic segments of activity, M1, M2, M3 and M4. During a simulation, master process 300 continuously cycles through these four segments. More specifically, master process 300 performs the following operations during segments M1, M2, M3 and M4.

M1: master process 300 processes events from its own scheduled set of current events;

M2: master process 300 waits for all slave processes to send their updated port signal values to master process 300 (this facilitates synchronizing to the end of all slave S2 segments which are described below);

M3: master process 300 propagates new value changes received during the M2 segment through a master partition; and M4: master process 300 sends any updated port signal values to each of the respective slave processes (which effectively synchronizes to each of the slave S1 segments), and also sends next time and delta information.

Similarly, each of the slave processes includes a time synchronizer which divides the operation of the slave processes into three cyclic segments of activity S1, S2 and S3. During a simulation, the slave processes continuously cycle through these three segments. More specifically, the following operations are performed during segments S1, S2 and S3.

S1: a slave processes the events from its own scheduled set of current events;

S2: the slave process sends its updated port signal values and the time of its next event to the master process (this facilitates synchronization to the end of the master M2 segment); and S3: the slave process waits for the master process to send its updated port signal values (this facilitates synchronizing to the master M4 segment).

Figure 4:
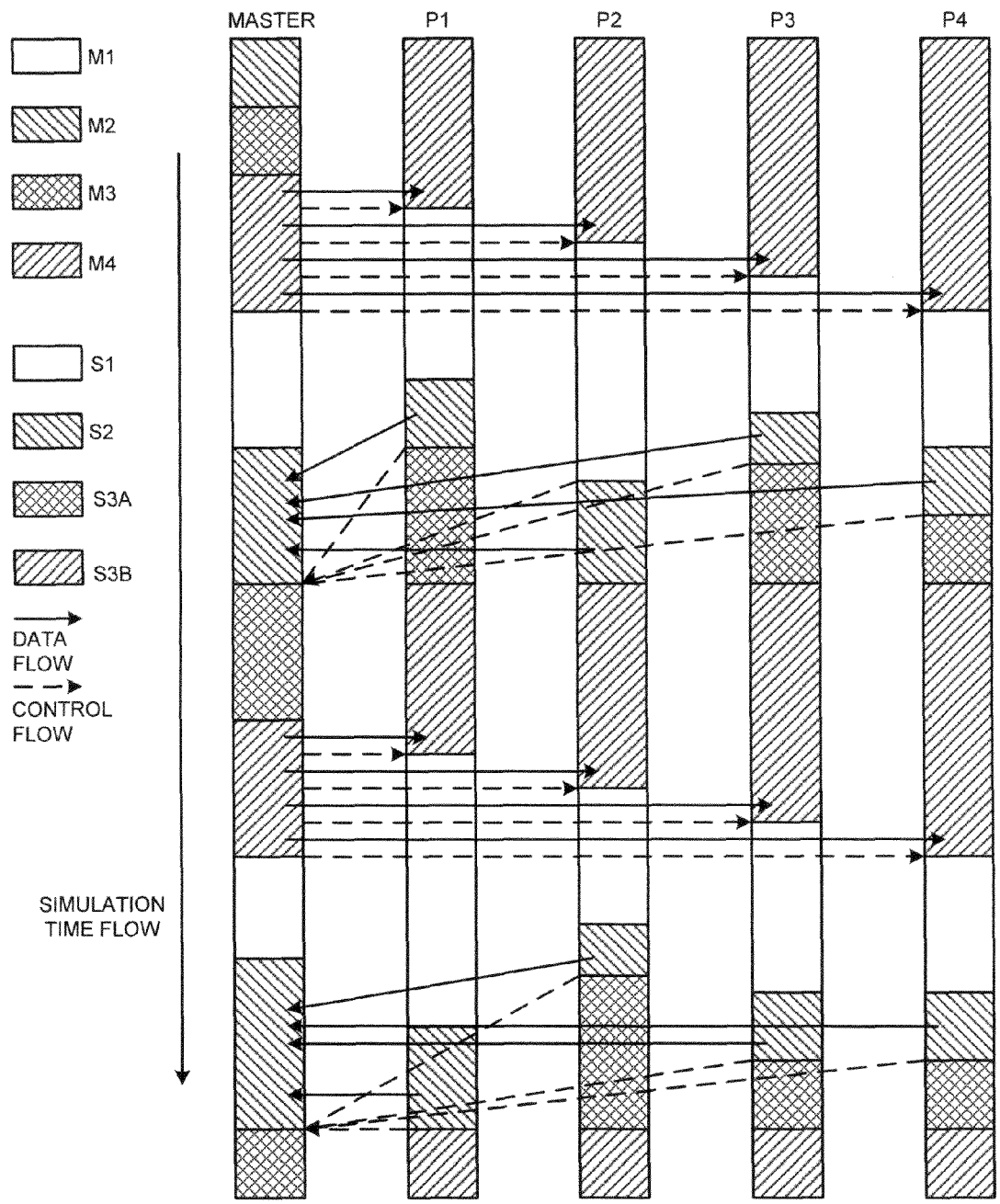
FIG. 4 illustrates signal transfers between master and slave processes in accordance with an embodiment of the present invention.

The timing of signal transfers between master and slave processes is illustrated in the example which appears in FIG. 4. Note that control signals are represented by dashed arrows and data signals are represented by solid arrows.

Starting in segment M2, the master process waits for all slave processes to send their updated port signal values. When all of the updated port signal values are received, the master process propagates new value changes received during the M2 segment through the master partition (segment M3). The master process then sends any updated port signal values to each of the respective slave processes, and also sends time and delta information (segment M4). Finally, the master process processes events from its own scheduled set of current events (segment M1). The cycle then repeats.

On the slave side, after receiving updated port signal values from the master process, each slave process processes events from its own scheduled set of events (segment S1). Each slave process then sends updated port signal values and the time of its next event to the master process (segment S2). The slave processes then wait for the master process to send another set of updated signal values (segment S3) and the cycle repeats.

Representing Execution Run Time

Figure 5:
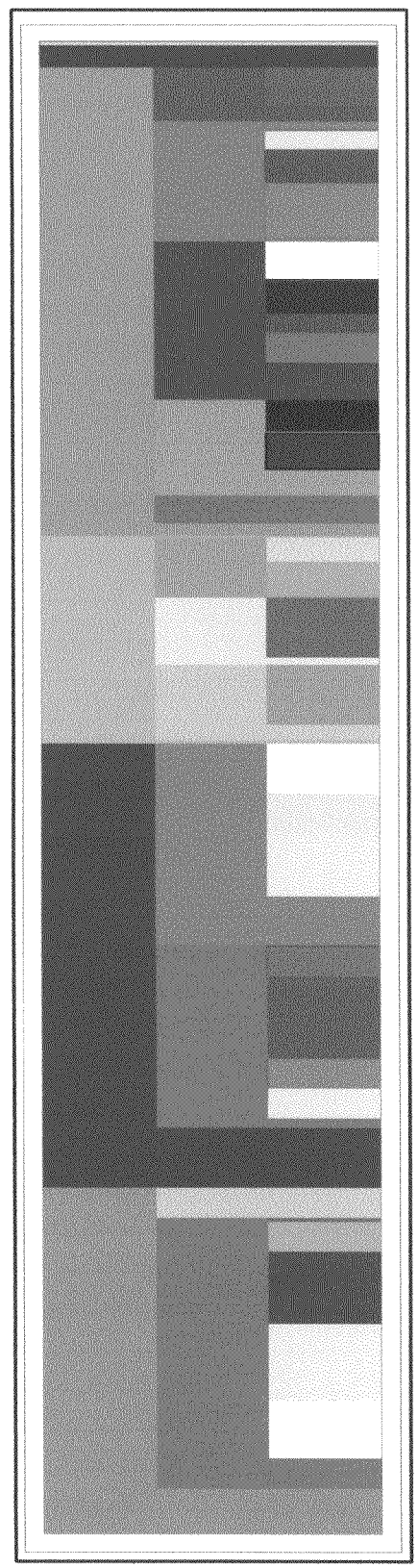
FIG. 5 presents a diagram illustrating the distribution of execution run time between modules in accordance with an embodiment of the present invention.

FIG. 5 presents a diagram illustrating how execution run time is distributed between modules and sub-modules of a design in accordance with an embodiment of the present invention. Note that the total execution time of a module includes the execution time of all sub-modules of the module, as well as execution time for the module. The length of the bar represents total serial execution time for a circuit. The bar in FIG. 5 is split into three layers. The first layer represents the time taken by each highest-level module. For each highest-level module, the second layer represents the time taken by both the highest module and respective sub-modules of the highest-level module. Similarly, for each sub-module, the third layer represents the time taken by both the sub-module and each sub-module of the sub-module. Note that this process can be repeated for many more levels of sub-modules and associated layers in the bar.

Moreover, when a user moves a cursor over an area associated with a specific sub-module, a popup annotation appears that maps the area to a specific part of the design. The popup annotation can also provide a numerical value for the execution time of the sub-module.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for profiling a serial simulation of a circuit to estimate the performance of a parallel simulation of the circuit, comprising:

profiling execution of module instances during a serial simulation of the circuit, wherein each module instance includes code which simulates signal propagation through a corresponding circuit module; and using execution times for the module instances obtained from the serial simulation to estimate the performance of a parallel simulation of the circuit.

2. The method of claim 1, wherein profiling the execution of the module instances involves:

instrumenting code which simulates signal propagation through the module instances; and serially executing the instrumented code to gather execution times for the module instances.

3. The method of claim 1, wherein the execution times for the module instances include:

execution times within the module instances; and execution times through ports which are used to communicate signals between module instances.

4. The method of claim 1, wherein estimating the performance of the parallel simulation involves:

partitioning the circuit; and estimating the performance of the parallel simulation based on the partitioning and the execution times of the module instances within the partitions.

5. The method of claim 4, wherein the parallel simulation involves a master process and a set of slave processes;

wherein the master process coordinates actions of the set of slave processes;

wherein each slave process is responsible for executing a different partition; and wherein the parallel simulation involves iteratively executing delta time slices;

wherein executing a given delta time slice involves, executing the master process, executing the slave processes in parallel, and communicating between the master and slave processes.

6. The method of claim 5, wherein estimating the performance of the parallel simulation involves accounting for:

an execution time of the master process;

a maximum execution time across all of the slave processes; and a communication time between the master and slave processes.

7. The method of claim 4, wherein communicating between the master process and the slave processes involves communicating value changes that cross partition boundaries.

8. The method of claim 4, wherein estimating the performance of the parallel simulation involves estimating the performance of a parallel simulation for a number of possible partitionings of the circuit.

9. A computer-readable storage medium storing instructions that when executed by a computer cause the computer to perform a method for profiling a serial simulation of a circuit to estimate the performance of a parallel simulation of the circuit, the method comprising:

profiling execution of module instances during a serial simulation of the circuit, wherein each module instance includes code which simulates signal propagation through a corresponding circuit module; and using execution times for the module instances obtained from the serial simulation to estimate the performance of a parallel simulation of the circuit.

10. The computer-readable storage medium of claim 9, wherein profiling the execution of the module instances involves:

instrumenting code which simulates signal propagation through the module instances; and serially executing the instrumented code to gather execution times for the module instances.

11. The computer-readable storage medium of claim 9, wherein the execution times for the module instances include:

execution times within the module instances; and execution times through ports which are used to communicate signals between module instances.

12. The computer-readable storage medium of claim 9, wherein estimating the performance of the parallel simulation involves:

partitioning the circuit; and estimating the performance of the parallel simulation based on the partitioning and the execution times of the module instances within the partitions.

13. The computer-readable storage medium of claim 12, wherein the parallel simulation involves a master process and a set of slave processes;

wherein the master process coordinates actions of the set of slave processes;

wherein each slave process is responsible for executing a different partition; and wherein the parallel simulation involves iteratively executing delta time slices;

wherein executing a given delta time slice involves,
executing the master process,
executing the slave processes in parallel, and
communicating between the master and slave processes.

14. The computer-readable storage medium of claim 13, wherein estimating the performance of the parallel simulation involves accounting for:

an execution time of the master process;

a maximum execution time across all of the slave processes; and a communication time between the master and slave processes.

15. The computer-readable storage medium of claim 12, wherein communicating between the master process and the slave processes involves communicating value changes that cross partition boundaries.

16. The computer-readable storage medium of claim 12, wherein estimating the performance of the parallel simulation involves estimating the performance of a parallel simulation for a number of possible partitionings of the circuit.

17. An apparatus that profiles a serial simulation of a circuit to estimate the performance of a parallel simulation of the circuit, comprising:

a hardware-based serial profiler configured to profile execution of module instances during a serial simulation of the circuit, wherein each module instance includes code which simulates signal propagation through a corresponding circuit module; and a hardware-based estimation mechanism configured to use execution times for the module instances obtained from the serial simulation to estimate the performance of a parallel simulation of the circuit.

18. The apparatus of claim 17, wherein the serial profiler is configured to:

instrument code which simulates signal propagation through the module instances; and serially execute the instrumented code to gather execution times for the module instances.

19. The apparatus of claim 17, wherein the execution times for the module instances include:

execution times within the module instances; and execution times through ports which are used to communicate signals between module instances.

20. The apparatus of claim 17, wherein the estimation mechanism is configured to:

partition the circuit; and estimate the performance of the parallel simulation based on the partitioning and the execution times of the module instances within the partitions.

21. The apparatus of claim 20, wherein the parallel simulation involves a master process and a set of slave processes;

wherein the master process coordinates actions of the set of slave processes;

wherein each slave process is responsible for executing a different partition; and wherein the parallel simulation involves iteratively executing delta time slices;

wherein executing a given delta time slice involves,
executing the master process,
executing the slave processes in parallel, and
communicating between the master and slave processes.

22. The apparatus of claim 21, wherein while estimating the performance of the parallel simulation, the estimation mechanism is configured to account for:

an execution time of the master process;

a maximum execution time across all of the slave processes; and a communication time between the master and slave processes.

23. The apparatus of claim 20, wherein communications between the master process and the slave processes involve communications of value changes that cross partition boundaries.

24. The apparatus of claim 20, wherein the estimation mechanism is configured to estimate the performance of a parallel simulation for a number of possible partitionings of the circuit.

* * * * *